United States Patent
Robert

(10) Patent No.: US 8,156,807 B2
(45) Date of Patent: Apr. 17, 2012

(54) PIEZO-RESISTIVE DETECTION RESONANT DEVICE MADE USING SURFACE TECHNOLOGIES

(75) Inventor: Philippe Robert, Grenoble (FR)

(73) Assignee: Commissariat a l'Energie Atomique, Paris (FR)

( * ) Notice: Subject to any disclaimer, the term of this patent is extended or adjusted under 35 U.S.C. 154(b) by 835 days.

(21) Appl. No.: 12/214,627

(22) Filed: Jun. 20, 2008

(65) Prior Publication Data

US 2008/0314148 A1    Dec. 25, 2008

(30) Foreign Application Priority Data

Jun. 25, 2007   (FR) ..................... 07 55992

(51) Int. Cl.
*G01P 15/10*    (2006.01)
(52) U.S. Cl. ............... 73/514.29; 73/579; 73/504.12
(58) Field of Classification Search ............. 73/579, 73/514.29, 514.33, 704, 862.59, 504.12, 73/504.16
See application file for complete search history.

(56) References Cited

U.S. PATENT DOCUMENTS

| | | | |
|---|---|---|---|
| 6,389,898 B1 * | 5/2002 | Seidel et al. | 73/514.29 |
| 6,564,637 B1 * | 5/2003 | Schalk et al. | 73/504.12 |
| 6,848,320 B2 * | 2/2005 | Miyajima et al. | 73/763 |
| 7,819,005 B2 * | 10/2010 | Rueger | 73/579 |
| 2006/0032306 A1 | 2/2006 | Robert | |

FOREIGN PATENT DOCUMENTS

| EP | 1273896 A2 | 1/2003 |
|---|---|---|
| EP | 1626282 A1 | 2/2006 |

OTHER PUBLICATIONS

M. Aikele et al., "Resonant Accelerometer with Self-Test," Sensors and Actuators A 92 (2001), pp. 161-167.
Eklund, E. Jesper et al., "Single-Mask SOI Fabrication Process for Linear and Angular Piezoresistive Accelerometers with On-Chip Reference Resistors," Department of Electrical Engineering and Computer Science, pp. 656-659, 2005.
Dazhong Jin et al., "High-Mode Resonant Piezoresistive Cantilever Sensors for Tens-Femtogram Resoluble Mass Sensing in Air," Journal of Micromechanics and Microengineering, 16, 2006, pp. 1017-1023.
Reck, K. et al., "Piezoresistive Effect in Top-Down Fabricated Silicon Nanowires," MEMS 2008, Tucson, AZ, USA, Jan. 13-17, 2008, pp. 717-720.

* cited by examiner

*Primary Examiner* — John Chapman, Jr.
(74) *Attorney, Agent, or Firm* — Nixon Peabody LLP

(57) ABSTRACT

This invention relates to a resonant device with detection in the piezo-resistive plane made using surface technologies on a bulk, which comprises a resonator connected to this bulk by at least one embedded portion, means of exciting this resonator and detection means comprising at least one suspended beam type strain gauge made from piezo-resistive material, in which each strain gauge has a common plane with the resonator, and is connected to this resonator at a point situated outside of this at least one embedded portion to increase the stress observed by this strain gauge.

21 Claims, 6 Drawing Sheets

PIEZO-RESISTIVE DETECTION RESONANT DEVICE MADE USING SURFACE TECHNOLOGIES

CROSS REFERENCE TO RELATED APPLICATIONS or PRIORITY CLAIM

This application claims priority to French Patent Application No. 07 55992, filed Jun. 25, 2007.

TECHNICAL FIELD

The invention relates to a piezo-resistive detection resonant device made using surface technologies.

The field of the invention is particularly that of silicon micro/nano-sensors, accelerometers, gyrometers and force sensors.

STATE OF THE PRIOR ART

To analyse the state of the prior art, we will successively analyse that of resonant sensors and that of piezo-resistive sensors.

Resonant Sensors

In the prior art, resonant sensors may be made:
either using volume technology, in which the sensitive element of the sensor is made from the entire thickness of the bulk, generally by using wet etching of silicon or quartz,
or using surface technology, in which the silicon bulk is only machined on a fraction of its thickness, typically from a few micrometers to several tens of micrometers in thickness.

The field of the invention is that of MEMS sensors ("Micro Electro-Mechanical System") using surface technology, as described, for example, in the document [1], *"Resonant accelerometer with self-test"* by M. Aibele, K. Bauer, W. Fisher, F. Neubauer, U. Prechtel, J. Schalk, and H. Seidel (*Sensors and actuators* A92, 2001, pages 161 to 167).

It may be observed on resonant type inertia sensors made using surface technology that:
The resonators vibrate in the plane and the excitation/detection electrodes are obtained by DRIE ("Deep Reactive Ion Etching") plasma etching.
the machining using DRIE etching and the liberation via etching of a sacrificial layer permits the design of the sensor to be optimised, with in particular the possibility of bringing the resonator closer to the hinge.
For all of these sensors, the detection is made using:
either electrostatic means,
or piezo-resistive means, with embedded resistors.

When the sensors are miniaturised, especially for NEMS sensors ("Nano Electro-Mechanical System"), detection becomes a problem:
due to the very low capacity values to be measured in the case of electrostatic detection, or
due to the difficulty in making piezo-resistive gauges for detection with embedded resistors.

Piezo-Resistive Sensors

The field of the invention is especially that of piezo-resistive detection resonant sensors made using surface technology, with high sensitivity and accuracy (Signal/noise ratio, low temperature drift), that are adaptable to NEMS sensors, which is to say to very small (nanometric scale) sensors.

In the prior art of non-resonant, MEMS piezo-resistive sensors, the gauges on the surface of the test body only detect a stress outside of the plane. As a result:
this greatly restricts the designs of the sensors, especially for bi-axial integrated sensors, such as for inertia sensors for example,
poor adaptation for sensors made using surface technology,
poor adaptation for "ultra-miniaturised" sensors, such as NEMS sensors, as it is difficult to define, with sufficient accuracy and without adding mechanical stresses due to the metallisations on the test body, the doped and connection zones to make the gauge bridges on beams of just a few tens of nanometers wide.

The document [2], *"High-mode resonant piezo-resistive cantilever sensors for tens-fentogram resoluble mass sensing in air"* by Dazhonh Jin and al (2006, *J. Micromech.,* 16, pages 1017 to 1023), describes another type of sensor in which piezo-resistive gauges are made by depositing a conductive layer on the resonator. However such a deposit may create several major disadvantages:
adding stresses to the resonator,
a drop in the quality factor of the resonator,
the appearance of critical steps in addition to the steps for making the resonator itself: depositing a very thin layer of conductive material with very strict control of the thickness, alignment and photolithography and etching of the gauges on the critical beam,
detection outside of the plane, which may be a disadvantage in terms of the design, especially if electrostatic excitation that is isolated from the bulk is desired, in the case of a monocrystalline silicon resonator for example.

The document [3], *"Single-mask SOI fabrication process for linear and angular piezo-resistive accelerometers with on-chip reference resistors"* by Jasper Ekhund, E; Shkel, A.M.; (sensors, 2005 IEEE, 30 Oct.-3 Nov. 2005, pages 656 to 659), describes another type of sensor in which the gauges are defined by etching silicon. The silicon is no longer doped on the surface and the detection is carried out in the plane. Such a configuration is well suited to surface technology and to making sensors of very small dimensions (NEMS). However, it does not allow high levels of sensitivity and stability to be obtained. The response of the sensor is in fact directly proportional to the signal from the piezo-resistive gauges. Whereas in fact the piezo-resistive coefficients are highly dependent on the temperature.

The purpose of the invention is to overcome the disadvantages of the prior art by proposing a piezo-resistive detection resonant device (resonator and/or sensor), made using surface technology, with high sensitivity and accuracy (good signal/noise ratio, low temperature drift), that is simpler and more efficient for small dimensions.

DESCRIPTION OF THE INVENTION

The invention relates to a resonant device for detection in the piezo-resistive plane made using surface technologies on a bulk, characterised in that it comprises a resonator connected to this bulk by at least one embedded portion, wherein excitation means of this resonator and detection means comprise at least one suspended beam type strain gauge made from a piezo-resistive material, in that each strain gauge has at least one common plane with the resonator, and is connected to this resonator at a point situated outside of this at least one embedded portion to increase the stress observed by this strain gauge.

According to one preferred embodiment, the resonator has a length L in said plane, wherein the point is situated at a distance less than or equal to ¼ of L.

In one advantageous embodiment of the device of the invention, each piezo-resistive gauge comprises at least one silicon nanowire.

In another advantageous embodiment of the device of the invention, each piezo-resistive gauge comprises at least two parallel arms.

Advantageously, the excitation means are electrostatic, thermal or piezo-electric means.

Advantageously, the detection means comprise means of measuring the stress of the gauge by measuring the resistance between the end of the beam type gauge and the embedded portion of the resonator in the support or between two parallel arms close to the gauge.

Advantageously, each piezo-resistive strain gauge may be positioned perpendicularly to the resonator. The resonator and each piezo-resistive strain gauge may be made from a same piezo-resistive material, which may be silicon, SiGe . . ., wherein the resonator and each piezo-resistive strain gauge are then connected mechanically and electrically. Each piezo-resistive strain gauge may be defined by etching a beam in the silicon, wherein this piezo-resistive strain gauge works in tension/compression.

The invention also relates to a device which comprises a resonant sensor, for example silicon, which includes at least one resonator associated to an element capable of creating a variation of its characteristics (stress) according to the quantity to be measured, and in which a variation of the frequency of the resonator, detected by at least one associated strain gauge, results in this variation of the characteristics. Each resonator, equipped with at least one embedded portion in a bulk, includes excitation means, which may be electrostatic, thermal or piezo-electric means, and detection means comprising at least one piezo-resistive strain gauge connected to the resonator, and in which each piezo-resistive strain gauge has a common plane with the resonator, and is positioned close to a embedded portion of the resonator.

Advantageously, each resonator may vibrate in the plane. The excitation means of each resonator may comprise at least one electrode to excite it. Each piezo-resistive strain gauge may operate in compression/tension. Each piezo-resistive strain gauge may be defined by silicon etching.

In such a sensor function, a variation of the resonance frequency of the resonator arises from the variation of its characteristics, wherein this frequency variation is detected by the associated piezo-resistive strain gauges; this variation is deduced from the measurement of the resonance frequency of the resonator, by the strain gauges in time.

Therefore, for an inertia type sensor, a seismic mass, associated to the resonator, exerts under the action of an acceleration, a stress on the resonator. This stress induces a variation of the frequency of the resonator. Similarly, for a chemical sensor, in the presence of these specific molecules that "attach" themselves to the resonator that is coated with a material that can capture certain molecules, the effective mass of the resonator changes, which modifies its resonance frequency.

The device of the invention has the following advantages:

It permits a piezo-resistive detection resonator to be made, where the resonator part is decoupled from the piezo-resistive gauge part. The resonator part and the piezo-resistive gauge part, which are connected to one another, may be optimised separately. It is therefore possible:

to optimise the position of the piezo-resistive gauge on the resonator to increase the lever-arm effect, to reduce the cross section of the piezo-resistive gauge to increase its sensitivity, without modifying the resonance frequency of the resonator.

It permits to make a simple and sensitive measurement, that is particularly well adapted to ultra-miniaturisation.

It permits to make a differential measurement of the resonance frequency, by a Wheatstone bridge set-up of the piezo-resistive gauges.

It permits to increase the sensitivity by reducing the cross section of the piezo-resistive gauge, which may be made thinner (in its thickness).

It permits to use a very simple technology, for example etching the piezo-resistive gauge when the resonator and/or the sensor is etched: there is no need for additional implantations or deposits.

Contrary to a standard piezo-resistive sensor approach, as described for example in the document [3], *"Single-mask SOI fabrication process for linear and angular piezo-resistive accelerometers with on-chip reference resistors"* by Jasper Ekhund, E; Shkel, A.M.; (sensors, 2005 IEEE, 30 Oct.-3 Nov. 2005, pages 656 to 659), the device of the invention allows the sensitivity of the detector (provided in the first order by the resonator) to be decorrelated from the sensitivity of the piezo-resistive gauges (the thermal drift of the piezo-resistive coefficients has no influence on the stability and/or accuracy of the sensor).

With respect to the resonators and resonant sensors of the prior art, mainly based on the capacitive detection of the movement of the resonators, the measurement of a gauge bridge is much simpler than a capacitive measurement that is generally used for silicon resonant sensors, especially when very small components are used (NEMS), given the very small capacities concerned.

With respect to the piezo-resistive detection resonant sensors of the prior art, as described for example in the referenced document [1], *"Resonant accelerometer with self-test"* by M. Aibele, K. Bauer, W. Fisher, F. Neubauer, U. Prechtel, J. Schalk, and H. Seidel (*Sensors and Actuators* A92, 2001, pages 161 to 167), the device of the invention has the advantage of not having any metallisation on the beam and the possibility of resonating the resonator in the plane, which especially allows the excitation of the resonator by capacitive combs for example and in general by electrodes that are electrically isolated from the bulk.

With respect to the prior art, as described for example in the referenced document [2], *"High-mode resonant piezo-resistive cantilever sensors for tens-fentogram resoluble mass sensing in air"* by Dazhonh Jin and al (2006, *J. Micromech.*, 16, pages 1017 to 1023), the piezo-resistive gauge is no longer defined by depositing or implantation but by etching. This piezo-resistive gauge, which corresponds for example to a silicon beam defined by etching (dry or wet), is liberated from the bulk by a second etching operation (dry or wet).

Consequently the problems related to the depositing of conductive layers or the implantation of the gauges are eliminated. Such an approach is particularly well suited to surface technology and to the resonation of the resonators in the plane (advantage in terms of the design).

The device of the invention may be used in many applications, and especially for:

time bases, mechanical filters, accelerometers, gyrometers for applications for automobiles, mobile telephones, aviation . . .

resonant chemical sensors.

DETAILED DESCRIPTION OF SPECIFIC EMBODIMENTS

The invention relates to a piezo-resistive detection resonant device (resonator and/or sensor) made using surface technologies. This device comprises a resonator equipped with at least one embedded portion in a bulk, including excitation means, for example electrostatic, thermal or piezo-electric means, and detection means formed by at least one piezo-resistive strain gauge connected to the resonator which has a common plane with it, wherein a volume is liberated under this strain gauge and this resonator.

For maximum efficiency, the piezo-resistive gauge is placed close to a embedded portion of the resonator in order to be situated in a high stress zone. Consequently, the gauge will have little influence on the natural frequency of the resonator. It may thus be positioned in preference perpendicularly to the resonator (of the beam type for example), and as close as possible to the embedded portion to increase the lever-arm effect, which is to say the stress observed by the gauge. It may be obtained by etching in silicon, so as to be suspended above the bulk, after etching of a sacrificial layer.

Embodiments of the Resonator Type

Figure 1:
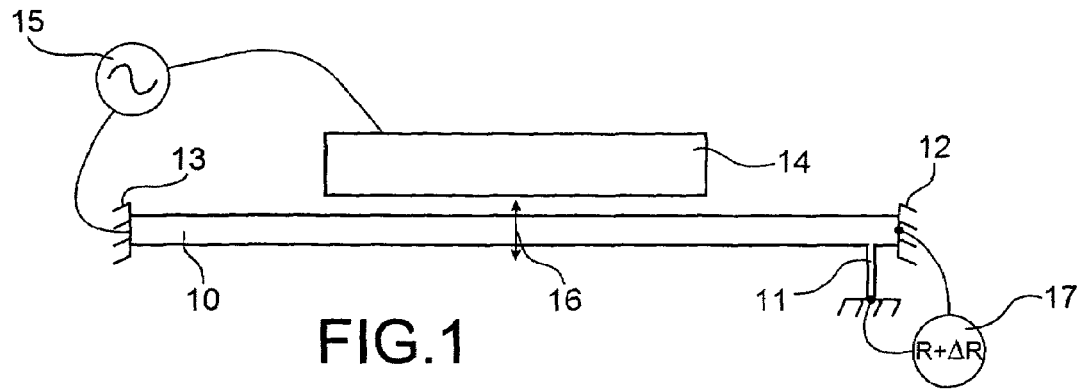
FIG. 1 illustrates a first embodiment of the resonator type of the device of the invention.
Figure 2:
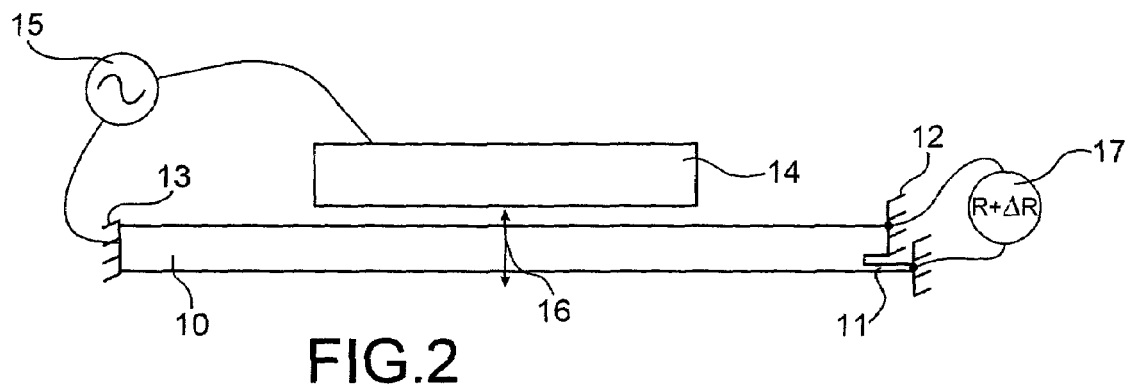
FIG. 2 illustrates a second embodiment of the resonator type of the device of the invention.

In a first embodiment of the resonator type, the device of the invention is a simple resonator. As illustrated in FIG. 1 a piezo-resistive strain gauge 11 of the beam type is attached to the beam type resonator 10 and placed perpendicularly to it in a position close to one of the two embedded portions 12 and 13. The fixed excitation electrode 14 of the resonator 10 is taken to an AC voltage with respect to it by means of AC voltage generation means 15. When the resonator is excited, it vibrates in the plane, as illustrated by the double arrow 16.

A person skilled in the art is able to position the detection strain gauge optimally on the vibrating beam by carrying out for example a finite element simulation of the design (using standard software such as ANSYS, Coventor ... ). For this purpose, the person would search for the optimum position which maximises the stress exerted on the detection strain gauge for a given deflection of the vibrating beam.

The excitation of the resonance of the resonator 10 may be achieved by means of electrostatic means, or by means of piezo-electric, thermal or electromagnetic means, normally used by a person skilled in the art.

The stress of the piezo-resistive gauge 11 may be measured between the embedded portion 12 of the resonator 10 and the end of the gauge beam 11 using standard measuring means 17.

Advantageously, the resistance may be measured by using a Wheatstone bridge.

In a second embodiment, the device of the invention is a simple resonator, in which the piezo-resistive strain gauge 11 is placed in parallel to the resonator 10 at a point as far away as possible from the neutral line, and close to the embedded portion 12.

For maximum efficiency, the piezo-resistive gauge 11 has as small a cross section as possible, while respecting certain conditions such as:
- a resistance of between several ohms and several hundred ohms,
- a resistance to buckling/stress in compliance with the specifications of the especially as concerns the impact resistance. Indeed, for a given effort, the stress is proportional to the cross section of the beam defining the piezo-resistive gauge. Consequently, a t thickness between the resonator and/or the other parts of the sensor and the strain may be envisaged.

Sensor Type Embodiments

The device of the invention is thus a sensor composed of two "cascade" test bodies, which are respectively the resonator and the piezo-resistive strain gauge. In this sensor, the resonator is associated to an element that can create a variation of its characteristics (stress, modification of the effective mass) depending on the quantity to be measured. The quantity to be measured (acceleration, rotation, pressure ... ) therefore exerts a stress on the resonator that is proportional to it. The effect of this stress is to modify the limit conditions of the resonator, which is translated by a modification of its resonance frequency or its vibration amplitude. The vibration measurement, by deformation of the resonator is then measured by the piezo-electric strain gauge, which is attached to the resonator, but which in fact is not part of it.

Several sensor type embodiments will now be considered.

Figure 3A:
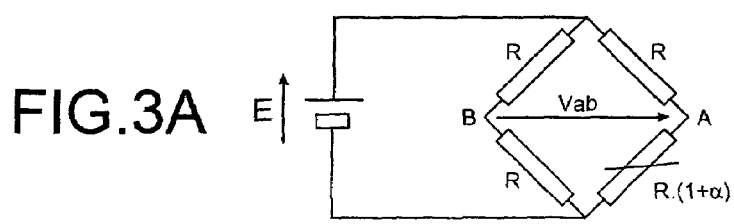
FIGS. 3A and 3B illustrate a first embodiment of the sensor type of the device of the invention.
Figure 3B:
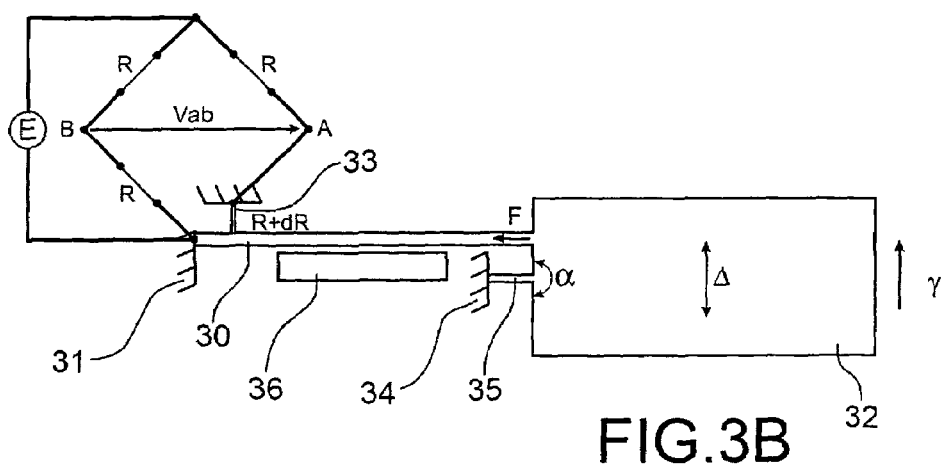

A—Planar Resonant Accelerometer with Piezo-Resistive Gauge Detection of the Invention A simple Wheatstone bridge set-up with a single sensitive element is illustrated in FIGS. 3A and 3B.

As illustrated in FIG. 3B this set-up comprises a resonator 30 fixed to a embedded portion 31 and to a seismic mass 32, and a fixed excitation electrode 36. A piezo-resistive strain gauge 33 is placed perpendicularly to the resonator, in a position close to the embedded portion 31. The seismic mass 32 is also fixed to an embedded portion 34 by means of a hinge 35.

The resistance measurement R+dR or R(1+α) of the strain gauge 33 is made by measuring a difference in voltage between the points A and B, as illustrated in FIGS. 3A and 3B, with three resistors R and a generator E.

The values $\alpha$, F and $\Delta$ are such that:
$\alpha$=rotation of the mass at the hinge 35, under the effect of an acceleration $\gamma$,
F=stress exerted on the resonator 30 under the effect of an acceleration $\gamma$, wherein the measurement of dR allows the acceleration $\gamma$ to be determined,
$\Delta$=sensitive axis of the seismic mass 32.

Figure 4A:
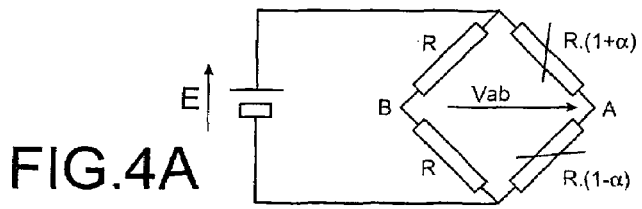
FIGS. 4A and 4B illustrate a second embodiment of the sensor type of the device of the invention.
Figure 4B:
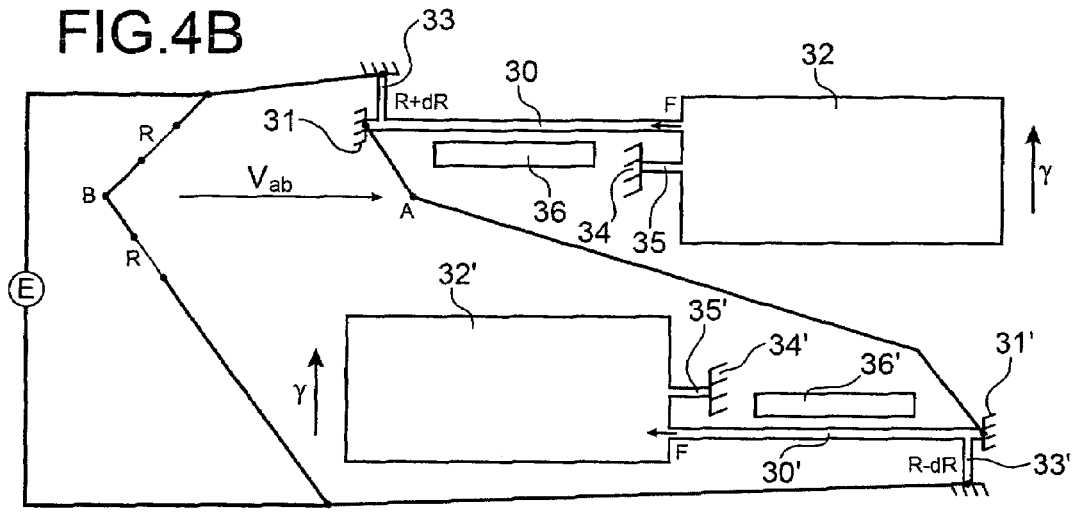

A differential Wheatstone bridge set-up may also be used as illustrated in FIGS. 4A and 4B.

In this set-up, two set-ups are used that are identical to that illustrated in FIG. 3A, wherein the elements of the first set-up have the same references 30 to 36 as in FIG. 3A, and the elements of the second set-up have the references 30' to 36'.

In this differential set-up, the values of the strain gauges 33 and 33' are respectively R+dR (or R (1+α)) and R−dR (or R(1−α)). It is therefore possible to identify the variation of the resistance dR, related to the variation in stress (σ) induced by the vibration of the resonator on the gauges (where dR is proportional to the stress) and consequently to deduce the acceleration γ. Indeed, it is known that in the case of a semiconductor piezo-resistive gauge, the resistivity changes depending on the form:

$$\frac{\Delta \rho}{\rho} = \frac{\pi_{44}}{2}\sigma_1 = \frac{\pi_{44} E}{2}\frac{\Delta l}{l},$$

where $\pi_{44}$ is the piezo-resistive coefficient of the material, and E is Young's modulus.

The longitudinal stress in the gauge $\sigma_1$ is of the form $\sigma_1 = F/(w.h)$, where h is the width of the gauge and w its height.

This stress value may be easily evaluated by a finite element simulation (ANSYS or Coventor software for example).

The variation in resistance is therefore proportional to the displacement of the resonator (which is to say its vibration). It is therefore possible to find the resonance frequency of the resonator by means of the resistance measurement of the piezo-resistive gauges.

In the case of a planar resonant accelerometer with piezo-resistive gauge detection according to the invention, as illustrated in FIG. 3B, the following typical dimensions may be used:
  thickness: several 0.1 μm or even several μm (for example: 4 μm)
  seismic mass: several 100 μm×several 100 μm (for example: 200×200 μm)
  hinge: several μm long×several 0.1 μm wide (for example: 5 μm long×0.8 μm wide)
  resonator: several 100 μm long×several 0.1 μm wide (for example: 400 μm long×1 μm wide)
  piezo-resistive gauge: several 10 μm or even several 100 μm long×several 0.1 μm wide (for example: 100 μm×0.3 μm)
  space between the embedded portion of the resonator and the gauge: 0.5 μm to several μm (for example 1.5 μm),
  space between the hinge and the resonator: 0.5 μm to several μm (for example 2 μm).

B—Planar Resonant Gyrometer with Piezo-Resistive Gauge Detection According to the Invention The basic concept of a resonant gyrometer, based on the detection of the force of Coriolis on a diapason tuning fork type system, is provided in the document [4], U.S. Patent Application Publication No. 2006/0032306. In the case of the invention, the force of Coriolis is directly exerted on the piezo-resistive gauges. The measurement of the piezo-resistive gauge bridge permits the speed of rotation Ω to be identified.

Figure 5:
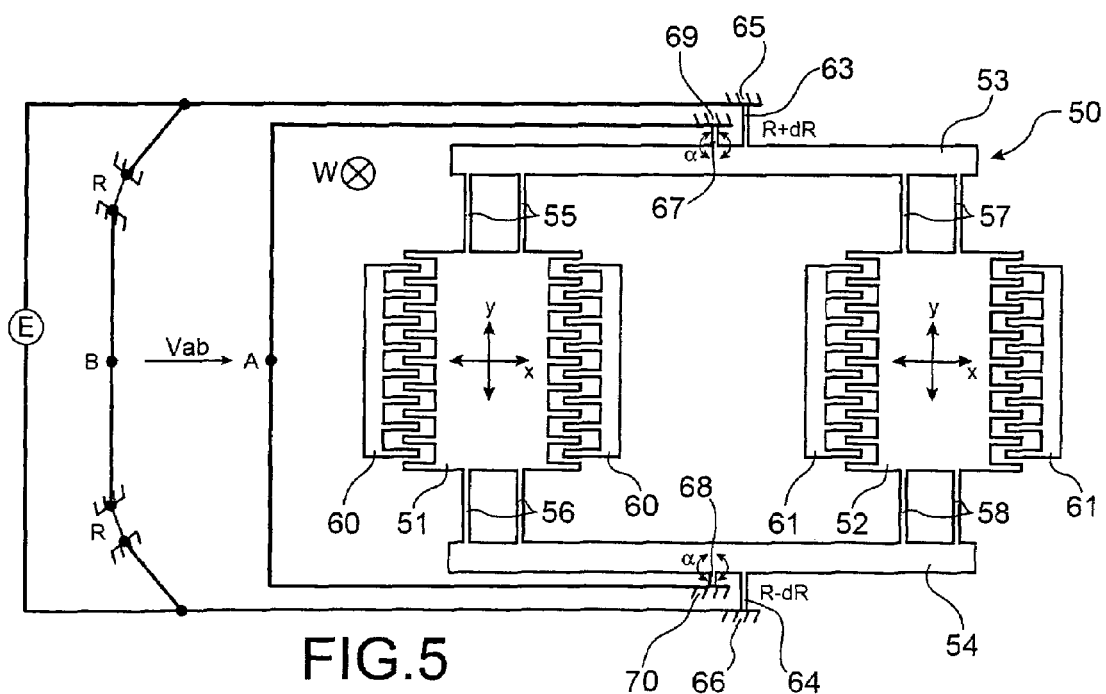
FIG. 5 illustrates a third embodiment of the sensor type of the device of the invention.

FIG. 5 illustrates a gyrometer with a Wheatstone bridge differential set-up. As shown schematically in this figure, the gyrometer 50 is composed of a support, not shown, and two seismic masses 51, 52 which are mobile in the plane (X, Y) of the support, and that can vibrate. Two connector arms 53, 54, which are mobile with respect to the support and parallel to one another, are connected to the mobile masses by means of deflection arms 55, 56, 57 and 58 which are sufficiently flexible to permit relative movements of the two masses 51, 52 with respect to the connector arms, while remaining sufficiently rigid to transmit the movements of these two masses to the connector arms. In preference, the connector arms 53 and 54 and the deflection arms, 55, 56, 57 and 58 form a rectangular frame.

Means are provided to make the masses 51 and 52 vibrate in the plane (X, Y) of the support, for example excitation combs 60, 61 intermeshing in one or both faces of each mobile mass 51, 52. These combs 60, 61 cause, by means of the electrostatic forces, a back and forth displacement of each mass in a first direction X, here from left to right on the sheet. Other means may be envisaged, such as electromagnetic excitation.

The masses 51, 52 are excited, preferably by the resonance or the proximity of the resonance, by means of electrostatic forces applied by means of the intermeshed combs designs 60, 61: all of the masses 51, 52 and the connection means 53, 54, 55, 56, 57 and 58 thus form an excitation resonator. Operation at the resonance in fact permits a large displacement amplitude to be obtained, and a high quality factor, this proportionally increasing the sensitivity of the gyrometer. Advantageously, the vibration of the masses is in phase opposition, which is to say that their movements are in opposite directions at each instant: the distance separating the two masses is variable, wherein this variation is tolerated by the deflection arms.

When the gyrometer 50 undergoes an angular displacement around an axis z perpendicular to the support, a force of Coriolis is generated on each mass, perpendicularly to the X and Z axes and therefore in this case in the vertical direction Y of the sheet, as a result of the composition of the vibration forced by the combs 60, 61 with the angular speed Ω. The forces of Coriolis are transmitted to the connector arms 53 and 54 by the deflection arms 55, 56, 57 and 58.

Each connector arm 53 or 54 is connected to a first end of a piezo-resistive strain gauge 63 or 64 positioned perpendicularly to it, of which the other end is connected to a embedded portion 65 or 66, and to hinge 67 or 68, whose other end is connected to a embedded portion 69 or 70.

The angle α corresponds to the rotation of the masses at the hinges 67 and 68, under the effect of the rotation Ω (effect of the force of Coriolis).

The voltage measured between the points A and B of the Wheatstone bridge permit the variation in resistance dR, and therefore the angular speed Ω to be identified.

In the case of the planar resonant gyrometer with detection by piezo-resistive gauges according to the invention, as illustrated in FIG. 5, dimensions of the same order may be used as those used in the typical dimensions of the accelerometer according to the invention considered above, as concerns the piezo-resistive gauges, the hinges and the space between the piezo-resistive gauges and the hinges, which is to say:
  piezo-resistive gauges: several 10 μm or even 100 μm long×several 0.1 μm wide (for example 100 μm×0.3 μm),
  hinges: several μm long×several 0.1 μm wide (for example 5 μm long×0.8 μm wide),
  space between a embedded portion of the resonator and a gauge: 0.5 μm to several μm (for example 1.5 μm),
  space between a hinge and a resonator: 0.5 μm to several μm (for example 2 μm).

Example of an Embodiment of a Simple Accelerometer Set-Up

Figure 6:
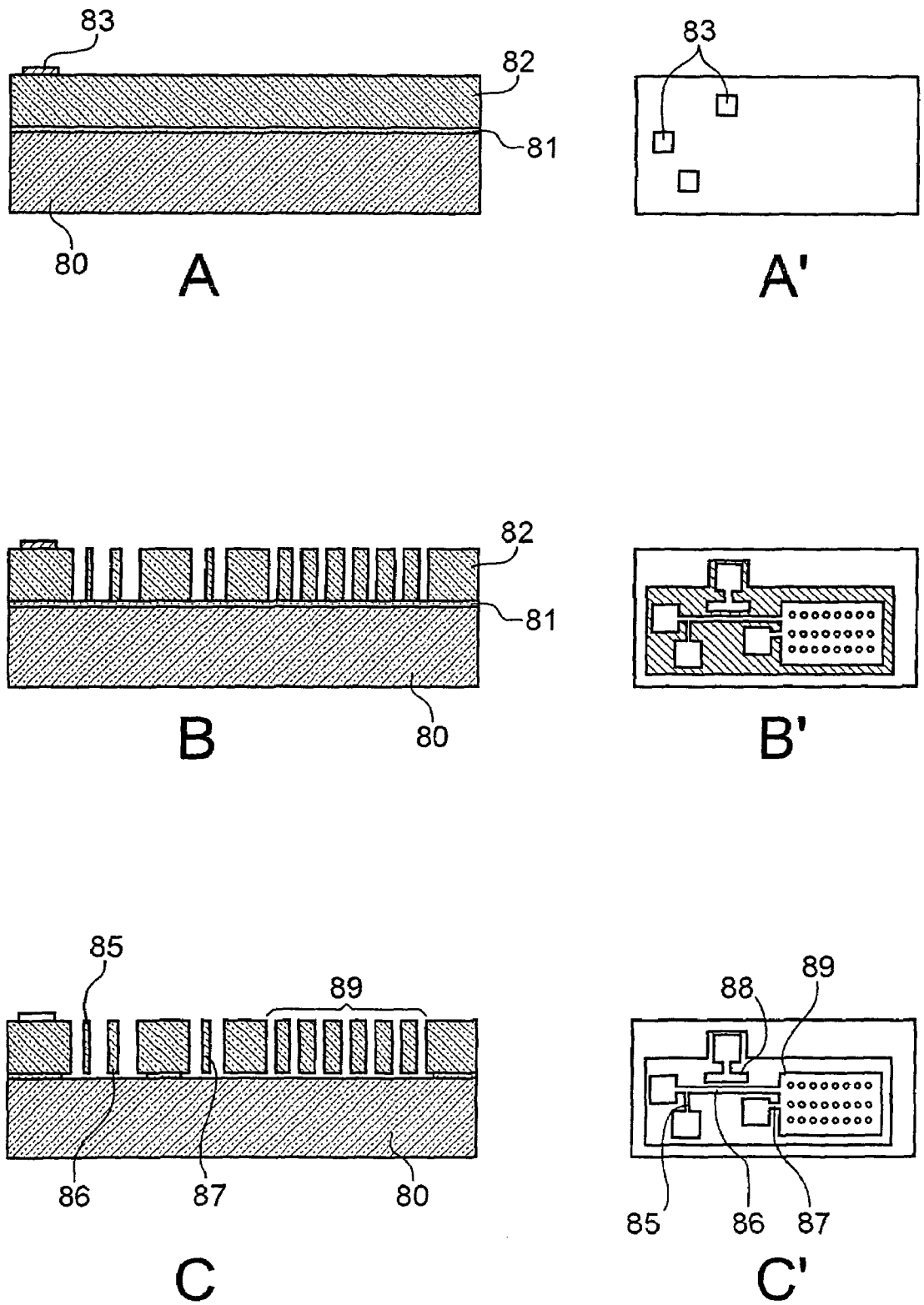
FIGS. 6A to 6C and 6A' to 6C' illustrate the steps of a first example of an embodiment, respectively in cross sectional and top views.
Figure 7:
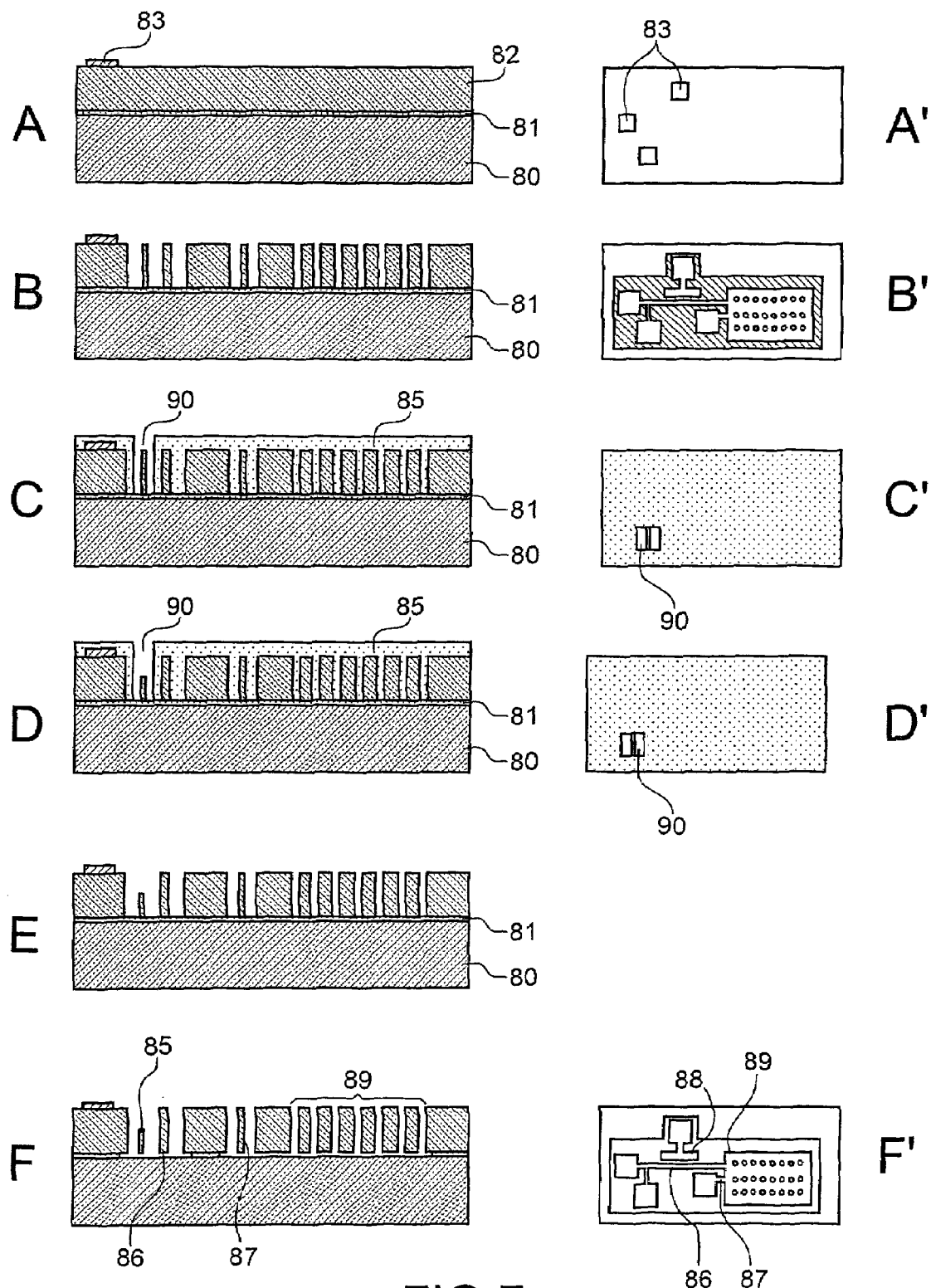
FIGS. 7A to 7F and 7A' to 7F' (there is no FIG. 7E') illustrate the steps of a second example of an embodiment, respectively in cross sectional and top views.

In a first example of an embodiment illustrated in FIGS. 6A to 6C (6A' to 6C'), there are the following steps:

A. A layer of Ti/Ni/Au is deposited on a SOI bulk comprising a base bulk 80 made of silicon, a sacrificial layer made of $SiO_2$ 81 (for example 0.4 μm thick) and a layer of silicon 82

(for example 4 µm thick). The contacts 83 are defined by photolithography and etching.

B. The mechanical design is defined by photolithography and DRIE etching, stopping on the sacrificial layer 81.

C. The components of the device of the invention are liberated by exposure to hydrofluoric acid (liquid or vapour) stopping after a determined period of time.

A piezo-resistive gauge 85, a resonator 86, a hinge 87, an excitation electrode of the resonator 88, and a seismic mass 89 are thus obtained.

In a second example of an embodiment, illustrated in FIGS. 7A to 7F (7A' to 7F', there is no FIG. 7E'), with thinning of the piezo-resistive strain gauge by etching, the following steps are used:

A. A layer of Ti/Ni/Au is deposited on a bulk of SOI type. The contacts are defined by photolithography and etching.

B. The mechanical design is defined by photolithography and DRIE etching of the mechanical design, stopping on the sacrificial layer ($SiO_2$).

C. A layer 84 to protect the mechanical design is deposited by photolithography, except in the strain gauge zone 90.

D. The strain gauge 90 is thinned down by DRIE etching stopping after a determined period of time.

E. The layer deposited in step C is stripped.

F. The components of the device of the invention are liberated by exposure to hydrofluoric acid (liquid or vapour) stopping after a determined period of time.

These two examples of embodiments are based on the use of SOI bulks (monocrystalline silicon component). However, such examples may be generalised to components made of polycrystalline silicon, monocrystalline SiGe, polycrystalline SiGe, . . .

Other Embodiments of the Device of the Invention

In one embodiment of the device of the invention, the suspended piezo-resistive gauges may be silicon nanowires. This slightly changes the succession of steps presented above (the nanowires are no more or no less than very thin silicon beams, typically $100 \times 100$ nm$^2$, that can be made using ebeam lithography for example). The main advantage is that these nanowires have the property of possessing huge piezo-resistive coefficients, as described in the referenced document [5], which potentially provides increased sensitivity of the sensor.

Figure 8:
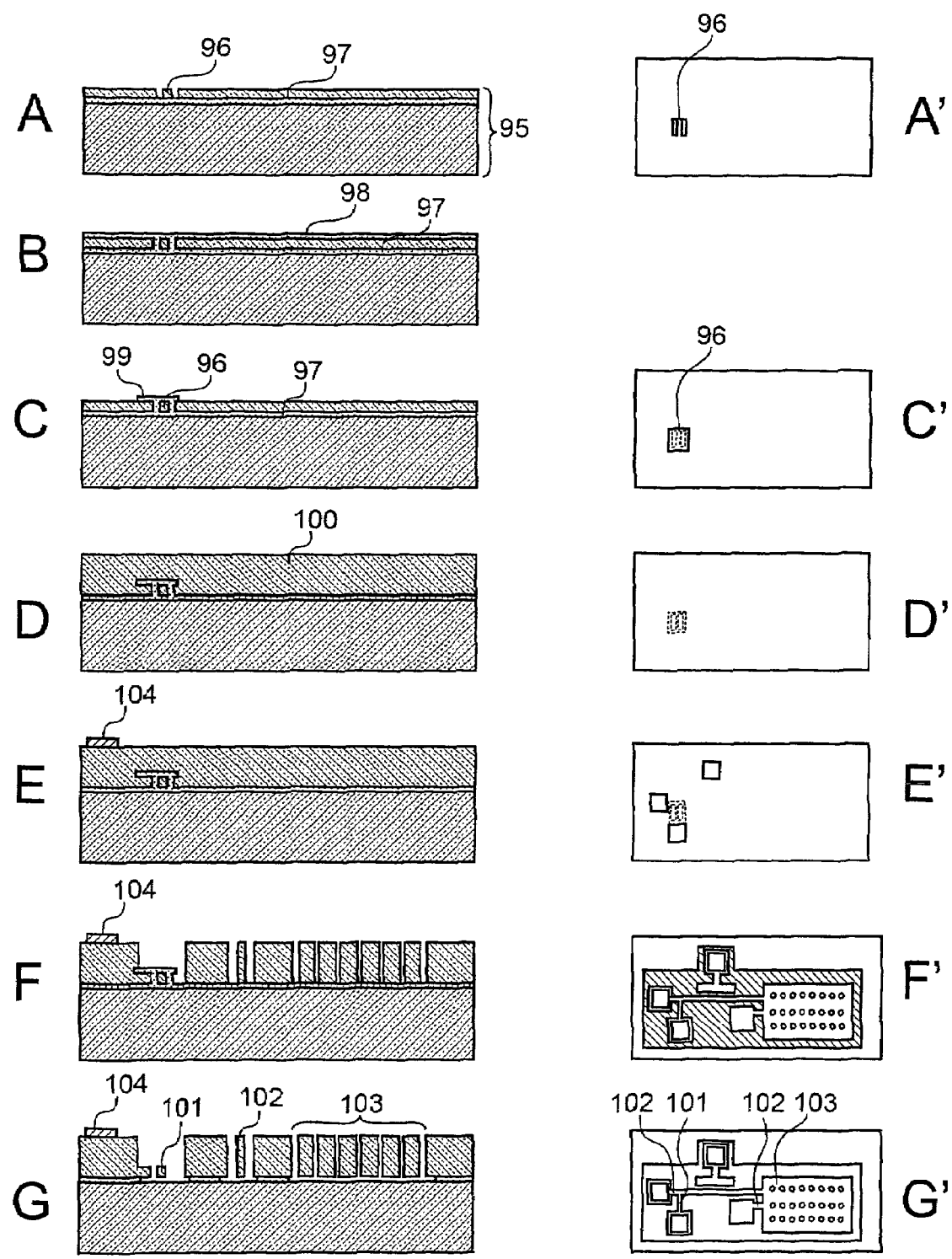
FIGS. 8A to 8G and 8A' to 8G' (there is no FIG. 8B') illustrate the manufacturing steps of an embodiment of the device of the invention, respectively in cross sectional and top views.

In this embodiment, an example of an adequate stack is as follows. On a bulk 95 of SOI type (for example 0.4 µm of $SiO_2$/0.15 µm Si):

A. The nanowire(s) are defined by DUV or ebeam lithography, and Si etching is carried out on a nanowire gauge 96 stopping on the layer of $SiO_2$ 97, as illustrated in FIGS. 8A and 8A'.

B. A layer of $SiO_2$ 98 is deposited (for example 0.5 µm) followed by planarisation stopping on the layer of Si and depositing of $SiO_2$ (0.5 µm for example), as illustrated in FIG. 8B.

C. Protection 99 of the gauge 96 is defined by lithography and $SiO_2$ etching, stopping on the Si, as illustrated in FIGS. 8C and 8C'.

D. Si 100 (4 µm) epitaxial growth is carried out as illustrated in FIGS. 8D and 8D'.

E. A deposit of Ti/Ni/Au is made (for the contacts) and the contacts 104 are defined by litho-etching, as illustrated in FIGS. 8E and 8E'.

F. The mechanical design is defined by lithography and DRIE etching, stopping on the layer of $SiO_2$, as illustrated in FIGS. 8F and 8F'.

G. The components are liberated by liquid or vapour liberation, stopping at the determined time, as illustrated in FIGS. 8G and 8G'. A thinned gauge (nanowire) 101, a hinge/resonator 102 and a seismic mass 103 are thus obtained.

We have not described here the elements illustrated which have already been described in reference to FIGS. 6A to 6C, 6A' to 6C', 7A to 7F and 7A' to 7F'.

Figure 9:
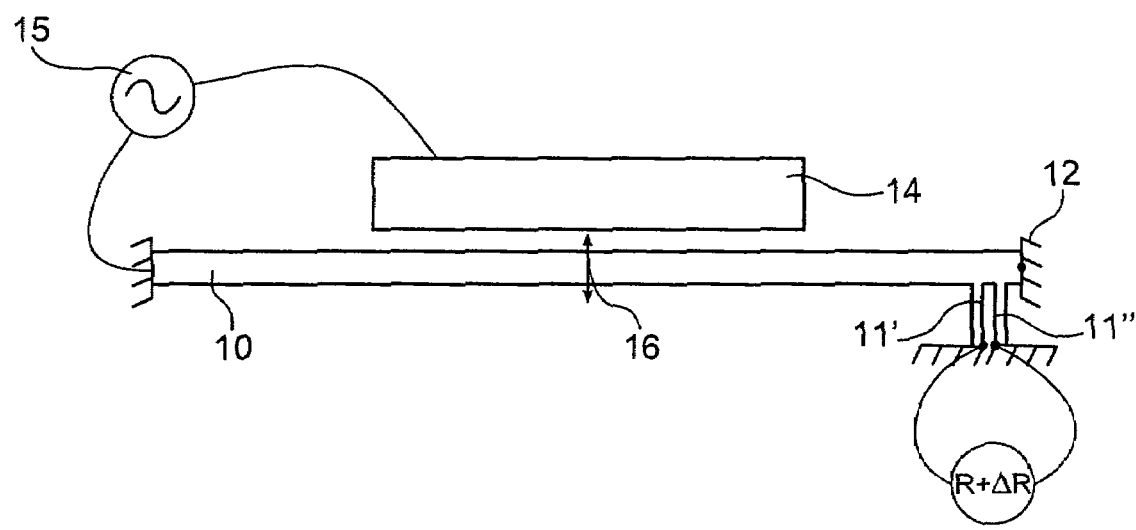
FIG. 9 illustrates another embodiment of the device of the invention.

In another embodiment of the device of the invention illustrated in FIG. 9, the piezo-resistive gauge is formed by two parallel arms 11' and 11" brought together so that they practically observe the same stress (typically 2 to 10 micrometers apart). In this case, the resistance measurement is made between the two arms 11' and 11" of the gauge.

The invention claimed is:

1. Resonant device with detection in a plane where piezo-resistive detection occurs, the resonant device made using surface micromachining substrate technologies on a bulk, characterised in that it comprises:
    a resonator connected to this bulk substrate by at least one embedded portion,
    means of exciting this resonator and
    detection means comprising at least one suspended beam type strain gauge made from piezo-resistive material, wherein each strain gauge has at least one common plane with the resonator, and is connected, in a first end to this resonator at a point situated outside of this at least one embedded portion to increase the stress observed by this strain gauge, and in a second end to the substrate.

2. Device according to claim 1, characterised in that the resonator has a length L in said plane, wherein said point is located at a distance less than or equal to ¼ of L.

3. Device according to claim 1, characterised in that each piezo-resistive gauge is a silicon nanowire.

4. Device according to claim 1, characterised in that each piezo-resistive gauge comprises two parallel arms.

5. Device according to claim 1, characterised in that the excitation means are electrostatic, thermal or piezo-electric means.

6. Device according to claim 1, characterised in that the detection means comprise means of measuring the stress of the gauge by measuring the resistance between the end of the beam type gauge and the embedded portion of the resonator at the support or between two parallel arms of the gauge.

7. Device according to claim 1, characterised in that each piezo-resistive strain gauge is positioned perpendicularly to the resonator.

8. Device according to claim 1, characterised in that the resonator and each piezo-resistive strain gauge are made from a same piezo-resistive material.

9. Device according to claim 8, characterised in that this material is silicon or SiGe and in that the resonator and each piezo-resistive strain gauge are connected mechanically and electrically.

10. Device according to claim 9, characterised in that each piezo-resistive strain gauge is defined by etching a beam in the silicon, wherein this gauge operates in tension/compression.

11. Device according to claim 9, characterised in that each resonator, equipped with at least one embedded portion in a bulk, includes excitation means and detection means comprising at least one strain gauge comprising a suspended beam made from piezo-resistive material connected to the resonator, and characterised in that each piezo-resistive strain gauge has at least one common plane with the resonator, and is positioned close to a embedded portion of the resonator to increase the lever-arm effect.

12. Device according to claim 1, which comprises a resonant sensor that has at least one resonator associated to an element capable of creating a variation of its characteristics depending on the quantity to be measured, and in which a variation of the frequency of the resonator or a variation of the resistance, detected by at least one associated strain gauge, results from this variation of characteristics.

13. Device according to claim 12, characterised in that each resonator vibrates in the plane.

14. Device according to claim 12, characterised in that the excitation means of each resonator comprise at least one electrode to excite it.

15. Device according to claim 12, characterised in that each piezo-resistive strain gauge operates in compression/tension.

16. Device according to claim 12, characterised in that each piezo-resistive strain gauge is defined by silicon etching.

17. Device according to claim 12, characterised in that a seismic mass, associated to the resonator, is capable, under the action of an acceleration, of exerting a stress on this resonator.

18. Accelerometer comprising at least one device according to claim 17.

19. Gyrometer comprising at least one device according to claim 17.

20. Device according to claim 12, characterised in that each resonator is coated with a material capable of capturing certain molecules.

21. The resonant device of claim 1, wherein the width of the beam type strain gauge is smaller than the width of the resonator.

\* \* \* \* \*